(12) United States Patent  (10) Patent No.: US 7,345,878 B2
Kim  (45) Date of Patent: Mar. 18, 2008

(54) PLASMA DISPLAY APPARATUS ASSEMBLY

(75) Inventor: Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 95 days.

(21) Appl. No.: 11/326,270

(22) Filed: Jan. 4, 2006

(65) Prior Publication Data
US 2006/0170349 A1 Aug. 3, 2006

(30) Foreign Application Priority Data
Jan. 5, 2005 (KR) .................. 10-2005-0000786

(51) Int. Cl.
H05K 7/20 (2006.01)
(52) U.S. Cl. .............. 361/703; 361/687; 361/714; 313/40; 313/45; 313/46; 313/48; 165/80.3; 349/59; 345/8; 345/156
(58) Field of Classification Search ......... 361/681, 361/683, 688, 689, 700, 699, 698, 702–714, 361/719; 165/80.3, 80.4, 133.34; 313/46, 313/40, 45, 493, 573, 582, 634, 294, 581, 313/48, 583; 345/1.3, 98, 8, 156, 87, 204, 345/102, 158, 169, 905; 349/59; 315/169.1–169.3
See application file for complete search history.

(56) References Cited
U.S. PATENT DOCUMENTS
6,744,186 B2 * 6/2004 Oishi et al. ............. 313/46
6,989,817 B2 * 1/2006 Tajima .................. 345/156
2005/0078446 A1 * 4/2005 Bae ....................... 361/687

FOREIGN PATENT DOCUMENTS
JP   02001044677 A  * 2/2001
JP   02001083888 A  * 3/2001
KR   2002021881 A   * 3/2002
KR   2003005527 A   * 1/2003
KR   1020040019150 A  3/2004

* cited by examiner

Primary Examiner—Michael Datskovskiy
(74) Attorney, Agent, or Firm—Knobbe Martens Olson & Bear LLP

(57) ABSTRACT

A plasma display apparatus assembly having high heat-dissipation efficiency is disclosed. In one embodiment, the plasma display apparatus assembly includes: i) a plasma display panel, ii) a chassis base coupled with a rear surface of the plasma display panel and supporting the plasma display panel, iii) a driver circuit board disposed behind the chassis base and having a circuit for driving the plasma display panel, iv) a signal transmission member transmitting an electric signal from the driver circuit board to the plasma display panel, the signal transmission member being connected at one side to the driver circuit board and at the other side to the plasma display panel and including at least one electronic device, v) a protective cover plate covering a portion of the signal transmission member on which the at least one electronic device is mounted, and vi) a heat pipe transferring heat generated by the electronic device to the protective cover plate.

7 Claims, 2 Drawing Sheets

PLASMA DISPLAY APPARATUS ASSEMBLY

CROSS-REFERENCE TO RELATED PATENT APPLICATIONS

This application claims the benefit of Korean Patent Application No. 10-2005-0000786, filed on Jan. 5, 2005, in the Korean Intellectual Property Office, the disclosure of which is incorporated herein in its entirety by reference.

BACKGROUND OF THE INVENTION

1. Field of the Invention

The present invention relates to a plasma display apparatus assembly.

2. Description of the Related Technology

In general, a plasma display apparatus is a flat panel display device in which discharge electrodes are respectively formed on surfaces of two substrates, and a discharge gas is injected into a sealed space between the substrates. When a predetermined voltage is applied to the respective discharge electrodes, a phosphor material of a phosphor layer is excited by ultraviolet radiation generated from the discharge gas so as to emit light, and an image is displayed by the emitted light.

Plasma display apparatus assemblies are manufactured by coupling separately prepared front and rear panels to form a plasma display panel, coupling a chassis base to a rear surface of the plasma display panel, attaching a driver circuit board, which can transmit an electric signal to the plasma display panel, to a rear surface of the chassis base, and mounting the resultant structure in a case. In particular, the driver circuit board drives the plasma display panel using a signal transmission member such as a tape carrier package (TCP).

When the plasma display panel is driven, the signal transmission member generates heat. More specifically, an electronic device such as a driver integrated circuit (IC) mounted on the signal transmission member when the plasma display panel is driven in a single scan method generates about twice as much heat as when driven in a dual scan method. Accordingly, overstress due to the heat may damage the electronic device.

SUMMARY OF CERTAIN INVENTIVE ASPECTS

One aspect of the present invention provides a plasma display apparatus assembly that can stably dissipate heat generated by signal transmission means.

Another aspect of the present invention provides a plasma display apparatus assembly comprising: i) a plasma display panel, ii) a chassis base coupled with a rear surface of the plasma display panel and supporting the plasma display panel, iii) a driver circuit board disposed behind the chassis base and having a circuit for driving the plasma display panel, iv) a signal transmission member transmitting an electric signal from the driver circuit board to the plasma display panel, the signal transmission member being connected at one side to the driver circuit board and at the other side to the plasma display panel and including at least one electronic device, v) a protective cover plate covering a portion of the signal transmission member on which the at least one electronic device is mounted and vi) a heat pipe transferring heat generated by the electronic device to the protective cover plate.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings, in which embodiments of the invention are shown.

Prior to describing a heat dissipating structure of a plasma display apparatus assembly according to an embodiment of the present invention, a heat dissipating structure of a typical plasma display apparatus assembly will be first explained with reference to FIGS. 1 and 2.

Figure 1:
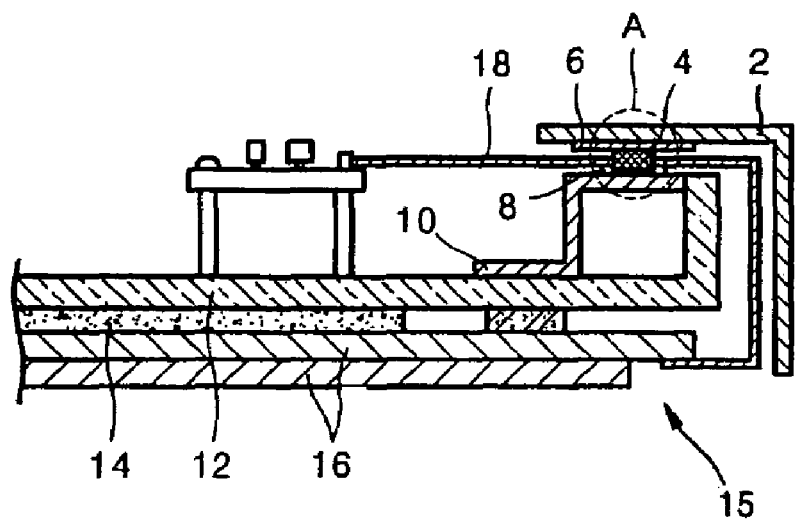
FIG. 1 is a cross-sectional view of a heat dissipating structure of a typical plasma display apparatus assembly.

FIG. 1 is a cross-sectional view of the heat dissipating structure of a typical plasma display panel wherein an electronic device 4 is mounted on a tape carrier package (TCP) 15. A plasma display panel 16 is coupled to a chassis base 12, and a heat conductive sheet 14 is interposed between the plasma display panel 16 and the chassis base 12 to transfer heat generated by the plasma display panel 16 to the chassis base 12. The TCP 15 is supported by a reinforcing member 10 that is disposed on the chassis base 12. A protective cover plate 2 covers the electronic device 4. A heat conduction sheet 6 is interposed between the protective cover plate 2 and the electronic device 4, and the protective cover plate 2 is screwed to the reinforcing member 10. A grease 8 is located between the electronic device 4 and the reinforcing member 10.

Figure 2:
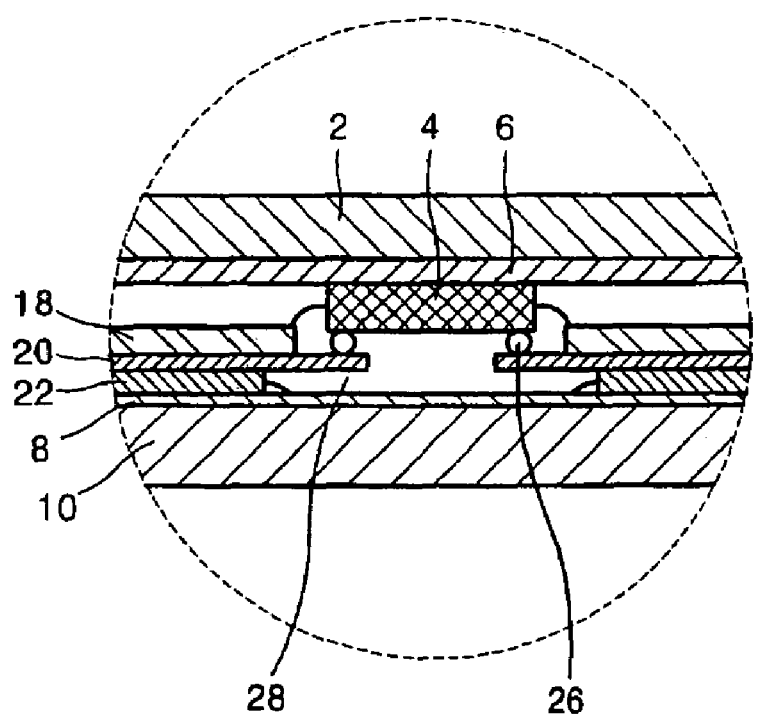
FIG. 2 is an enlarged cross-sectional view of a portion A of the plasma display apparatus assembly of FIG. 1.

FIG. 2 is an enlarged cross-sectional view of a portion A for explaining the TCP 15 of the plasma display apparatus assembly of FIG. 1. Referring to FIG. 2, the TCP 15 includes a base film 18, a patterned conductive layer 20 formed on the base film 18 to extend in a longitudinal direction of the TCP 15, and a solder-resist layer 22 protecting and insulating the conductive layer 20. The conductive layer 20 is connected to a circuit in the electronic device 4 through bumps 26. The lower part of the electronic device 4 may be charged with an insulating resin 28 to reinforce the connection between the electronic device 4 and the base film 18 and prevent a short circuit between conductive lines due to foreign substances. An epoxy resin having high heat conductivity may be used as the resin 28.

However, when heat generated by the electronic device 4 is transferred through the heat conduction sheet 6 to the protective cover plate 2, the plasma display apparatus assembly of FIG. 1 has a high thermal resistance, thereby failing to effectively dissipate the heat. It is difficult to dissipate the heat particularly when the TCP 15 drives the plasma display panel 16 in a high-definition (HD) single scan method.

Figure 3:
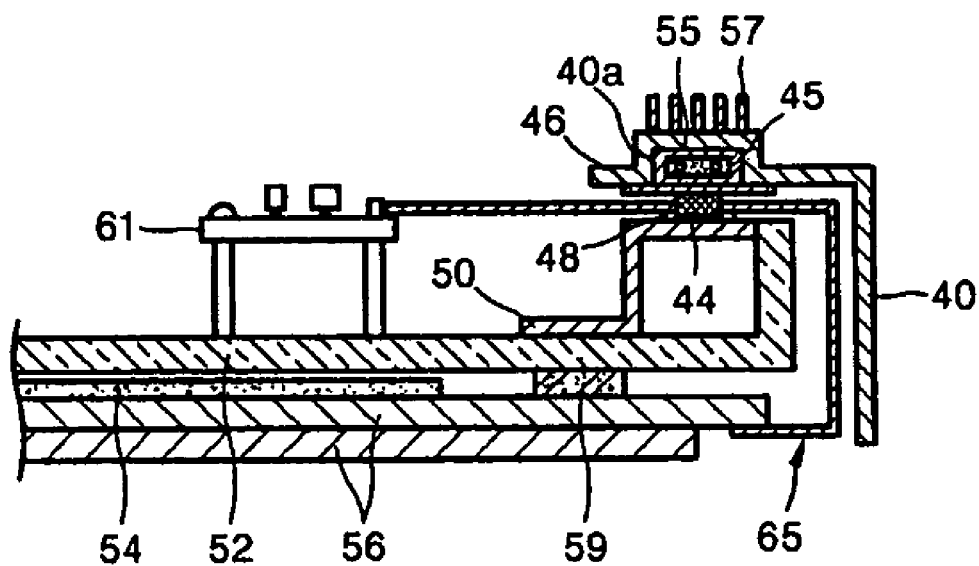
FIG. 3 is a cross-sectional view of a heat dissipating structure of a plasma display apparatus assembly according to an embodiment of the present invention.

FIG. 3 is a cross-sectional view of a heat dissipating structure of a plasma display apparatus assembly according to an embodiment of the present invention.

Referring to FIG. 3, the plasma display apparatus assembly includes a plasma display panel 56 displaying an image using a discharge gas, a chassis base 52 coupled with a rear surface of the plasma display panel 56 using a double-faced tape 59 and supporting the plasma display panel 56, and a driver circuit board 61 disposed behind the cassis base 52 and having a circuit for driving the plasma display panel 56. A heat conductive sheet 54 is interposed between the plasma display panel 56 and the chassis base 52 to diffuse heat generated by the plasma display panel 56. The plasma display panel 56 receives an electric signal from the driver circuit board 61 by means of a signal transmission member. In one embodiment, a TCP 65 is used as the signal transmission member. The TCP 65 is connected at one side to the plasma display panel 56 and connected at the other side to the driver circuit board 61. In another embodiment, instead of the TCP 65, a chip on film (COF) may be used as the signal transmission member.

In one embodiment, the TCP 65 is supported by a reinforcing member 50 that is disposed on the chassis base 52, and an electronic device 44 such as a driver IC is mounted on the TCP 65. The TCP 65 used in the present embodiment may have the same structure as in the FIG. 2 device, and thus a detailed explanation thereof will not be given. A protective cover plate 40 covers the TCP 65 on which the electronic device 44 is mounted. The protective cover plate 40 prevents damage to the TCP 65 and shields electromagnetic wave generated by the TCP 65. In one embodiment, the protective cover plate 40 is screwed to the reinforcing member 50.

In one embodiment, a thermal grease 48 is positioned between the TCP 65 and the reinforcing member 50 to reduce a pressure applied to the electronic device 44 and transfer heat generated by the electronic device 44 to the reinforcing member 50. In one embodiment, a heat conductive sheet 46 is interposed between the TCP 65 and the protective cover plate 40 to increase heat transfer from the electronic device 44 to the protective cover plate 40 and prevent damage to the electronic device 44 due to the pressure.

As described above, the electronic device 44, when the plasma display panel 56 is driven in an HD single scan method, emits about twice as much heat as compared to a dual scan driving method. In one embodiment, a recess 40a is formed in a portion of the protective cover plate 40 facing the electronic device 44 and a heat pipe 45 is inserted into the recess 40a. In this embodiment, heat generated during the operation of the electronic device 44 is quickly transferred to the protective cover plate 40 by a fluid flowing in the heat pipe 45. In one embodiment, although not shown in FIG. 3, the heat pipe 45 may extend longitudinally. In one embodiment, heat dissipating fins 57 are formed on the protective cover late 40, so that heat-transfer efficiency can be further improved.

Figure 4:
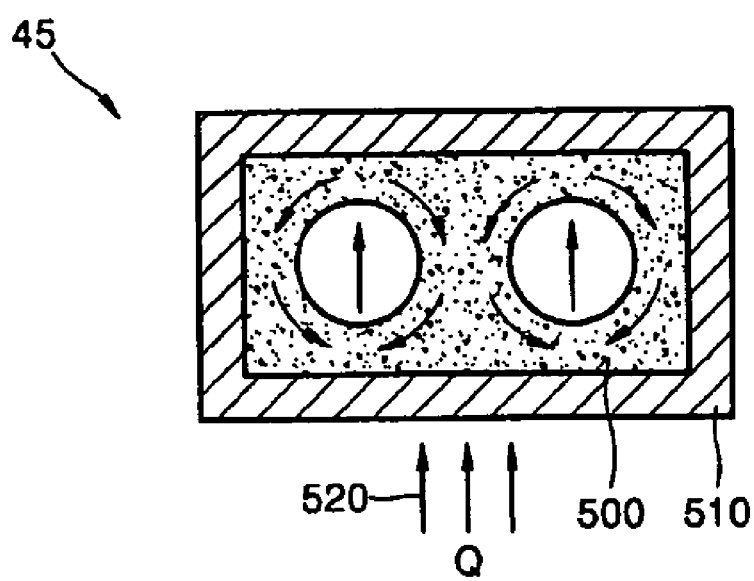
FIG. 4 is a cross-sectional view of a heat pipe of the plasma display apparatus assembly of FIG. 3.

FIG. 4 is a detailed cross-sectional view of the heat pipe 45 of the plasma display apparatus assembly of FIG. 3. In one embodiment, the heat pipe 45 may have a structure disclosed in Korean Patent Publication No. 2004-19150, which is incorporated by reference. Referring to FIG. 4, if heat (Q) 520 is generated by the electronic device 44, the heat (Q) 520 is transferred quickly through a wick 500 in an outer tube 510.

Due to the heat dissipating structure of the plasma display apparatus assembly of the present embodiment, the heat (Q) 520 generated by the electronic device 44 is transferred from the heat conductive sheet 46 through the heat pipe 45 to the protective cover plate 40. In particular, the heat emitted from the electronic device 44 is used to cause vaporization, flow, and condensation in the heat pipe 45, and then is transferred to the outside quickly.

As described above, the heat dissipating structure of the plasma display apparatus assembly according to one embodiment of the present invention quickly transfers heat generated by the electronic device 44 on the signal transmission member to the protective cover plate 40 through the heat pipe 45 with high heat transfer efficiency, the heat-dissipation capacity of the electronic device 44 can be significantly improved.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display apparatus assembly, comprising:
   a plasma display panel;
   a chassis base coupled with a rear surface of the plasma display panel and supporting the plasma display panel;
   a driver circuit board disposed in a rear portion of the chassis base and having a circuit configured to drive the plasma display panel;
   a signal transmission member configured to transmit an electric signal from the driver circuit board to the plasma display panel, the signal transmission member being connected at one side to the driver circuit board and at the other side to the plasma display panel and including at least one electronic device;
   a protective cover plate covering a portion of the signal transmission member on which the at least one electronic device is mounted; and
   a heat pipe configured to transfer heat generated by the at least one electronic device to the protective cover plate, wherein a recess is formed in a portion of the protective cover plate facing the electronic device, and the heat pipe is inserted into the recess.

2. The plasma display apparatus assembly of claim 1, further comprising a heat conductive sheet interposed between the protective cover plate and the electronic device.

3. A plasma display apparatus assembly, comprising:
   a plasma display panel;
   a chassis base coupled with a rear surface of the plasma display panel and supporting the plasma display panel;
   a driver circuit board disposed in a rear portion of the chassis base and having a circuit configured to drive the plasma display panel;
   a signal transmission member configured to transmit an electric signal from the driver circuit board to the plasma display panel, the signal transmission member being connected at one side to the driver circuit board and at the other side to the plasma display panel and including at least one electronic device;
   a protective cover plate covering a portion of the signal transmission member on which the at least one electronic device is mounted;
   a heat pipe configured to transfer heat generated by the at least one electronic device to the protective cover plate; and
   heat dissipating fins disposed on the protective cover plate.

4. A plasma display apparatus assembly, comprising:

a plasma display panel:

a chassis base coupled with a rear surface of the plasma display panel and supporting the plasma display panel;

a driver circuit board disposed in a rear portion of the chassis base and having a circuit configured to drive the plasma display panel;

a signal transmission member configured to transmit an electric signal from the driver circuit board to the plasma display panel, the signal transmission member being connected at one side to the driver circuit board and at the other side to the plasma display panel and including at least one electronic device;

a protective cover plate covering a portion of the signal transmission member on which the at least one electronic device is mounted;

a heat pipe configured to transfer heat generated by the at least one electronic device to the protective cover plate; and a reinforcing member disposed on the chassis base to support the signal transmission member.

5. The plasma display apparatus assembly of claim 1, wherein the signal transmission member is a tape carrier package (TCP) or a chip on film (COF).

6. A plasma display panel apparatus, comprising:

a signal transmission member, including at least one electronic device, configured to transmit an electric signal from a driver circuit board to a plasma display panel; and a heat pipe configured to transfer heat generated by the at least one electronic device to a protective cover plate, which covers a portion of the signal transmission member, wherein a recess is defined in a portion of the protective cover plate facing the electronic device, and the heat pipe is inserted into the recess.

7. A plasma display panel apparatus, comprising:

a signal transmission member, including at least one electronic device, configured to transmit an electric signal from a driver circuit board to a plasma display panel;

a heat pipe configured to transfer heat generated by the at least one electronic device to a protective cover plate, which covers a portion of the signal transmission member; and heat dissipating fins disposed on the protective cover plate.

* * * * *